United States Patent

Rubloff et al.

[19]

[11] Patent Number: 4,692,348
[45] Date of Patent: Sep. 8, 1987

[54] LOW TEMPERATURE SHALLOW DOPING TECHNIQUE

[75] Inventors: Gary W. Rubloff, Katonah; Marc F. Wittmer, Yorktown Heights, both of N.Y.

[73] Assignee: International Business Machines Corporation, Armonk, N.Y.

[21] Appl. No.: 890,893

[22] Filed: Jul. 28, 1986

Related U.S. Application Data

[63] Continuation of Ser. No. 622,949, Jun. 21, 1984, abandoned.

[51] Int. Cl.$^4$ .............................................. B05D 5/12
[52] U.S. Cl. ...................................... 437/82; 437/247
[58] Field of Search .............................. 427/85, 88, 93; 148/188

[56] References Cited

U.S. PATENT DOCUMENTS 4,293,587 10/1981 Trueblood ............................ 427/90
4,362,597 12/1982 Fraser et al. ........................ 156/643

Primary Examiner—John D. Smith
Assistant Examiner—Vi D. Dang
Attorney, Agent, or Firm—Jackson E. Stanland

[57] ABSTRACT

A technique is described for producing very shallow doped regions in a substrate, at low temperatures. The doped regions are not in excess of about 300 angstroms in depth, and are formed at temperatures less than 700° C. These shallow doped regions can be used in different applications, including the fabrication of semiconductor switching devices, diodes, and contacts. Overlayers containing the desired dopants are deposited on the substrate, after which an annealing step is carried out to institute the formation of a metallic compound. When the compound is formed, materials in the overlayers to be used as substrate dopants will be pushed ahead of the interface of the growing compound, and will be snowplowed into the top surface of the substrate, to produce the shallow doped region therein.

30 Claims, 7 Drawing Figures

DEPOSIT DOPED POLY SILICON

DEPOSIT METAL

ANNEAL

REMOVE OVERLAYERS

LOW TEMPERATURE SHALLOW DOPING TECHNIQUE

This application is a continuation of Ser. No. 622,949 filed June 21, 1984, now abandoned.

DESCRIPTION

1. Field of the Invention

This invention relates to a low temperature process for producing a very shallow doped region in a substrate, and more particularly to such a process wherein dopants in a layer overlying the substrate are driven into the substrate by the snowplow effect during the formation of a metal compound of the overlying layer, there being a minimum consumption of the underlying substrate during the formation of the shallow doped region.

2. Background Art

Semiconductor devices of very large scale integration (VLSI) have been developed by scaling down dimensions of the individual circuit elements. The trend in the near future is toward feature lengths below 1 micrometer. The lateral reduction of submicron structures has given rise to new problems, among them the most prominent one being the short channel effect in metal oxide semiconductor (MOS) field effect transistors. This undesirable effect can be elminiated by scaling down voltage and device size in all three dimensions, where not only the lateral dimensions (such as contact areas, gate lengths, and gate widths), but also the vertical dimensions (such as junction depths and thickness of gate oxides), have to be reduced.

While the necessity for providing shallow doped regions in semiconductors has been recognized, no suitable technique has been producing for providing very shallow doped regions at low temperatures. For example, conventional techniques for doping impurities into silicon require high temperature above 900° C., either for thermal diffusion or for annealing out the damage induced by ion implantation. For doping by ion implantation, the post-annealing at high temperatures is necessary to remove the structural damage caused by ion implantation and to insure that the dopants introduced into the semiconductor are electrically active. These high temperature processes, however, in general cause unnecessary redistribution of impurities and degradation of shallow junction structures. Therefore, a low temperature doping method is preferable.

A suitable low temperature method must be one which producing very shallow doped regions having depths of the order of a few hundred angstroms, or less, at temperatures less than 700° C. (or preferrably 500° C.) and in which there is minimal consumption of the substrate during formation of the doped region. At the present time, no such technique exists.

To solve these problems the present invention, dopes a substrate by the introduction of a dopant from an overlying layer, where metal compound formation in the overlying layer produces an interface which moves toward the substrate and pushes the dopant in front of it. This is the so-called "snowplow" effect wherein a dopant can be piled up in front of the interface by its growth motion. The effect is known in the art and is caused by rejection of the dopant by the growing metal compound, due to enhanced diffusion of the dopant during metal compound formation. Thus, the dopant originates in a layer overlaying the substrate and is pushed into the substrate to form a very shallow doped region in the substrate. This can proceed at a very low temperature.

References which generally deal with the redistribution of previously implanted dopants in a semiconductor by the snowplow effect include the following:

1. I. Ohdomari et al, Appl. Phys. Lett. 38 (12), page 1015, June 15, 1981.
2. M. Wittmer et al, J. Appl. Phys. 53 (10), page 6781, October 1982.
3. M. Wittmer et al, J. Appl. Phys. 49 (12), page 5827, December 1978.
4. J. B. Bindell et al, IEEE Trans. on Electron Devices, Vol. ED-27, No. 2, page 420, February 1980.
5. M. Wittmer et al, Physical Review B, Vol. 29, No. 4, page 2010, Feb. 15, 1984.
6. I. Ohdomari et al, Thin Solid Films, 89, page 349, 1982.

As noted in reference 1, the snowplow effect has been used to redistribute implanted substrate dopants during the growth of different types of compounds. For example, during thermal growth of $SiO_2$, dopant redistribution in the vicinity of the $SiO_2$—Si interface occurs. A similar effect occurs during the growth of near-noble metal silicides as discussed in others of these cited references. Such techniques have been suggested as a way to provide a low temperature process of redistributing dopants in a semiconductor substrate. However, the dopants were initially introduced in the substrate by ion inplantation, which requires a high temperature annealing step to produce electrically active dopants and to remove structural damage. Consequently, the complete device-forming process is one which requires high temperatures.

The following references describe the introduction of a dopant into an underlying semiconductor substrate where the dopant originates in an overlying layer.

7. U.S. Pat. No. 4,274,892
8. B. Studer-Solid State Electronics, Vol. 23, page 1181 (1980).
9. U.S. Pat. No. 4,356,622

In references 7 and 9, a high temperature process is used in which dopants are introduced into a substrate by an oxidation step. These high temperatures are similar to those used in conventional diffusion techniques, where it has been believed that dopants such as As and P would not be introduced into a silicon substrate unless high temperatures were used.

In reference 8, a doped metal layer is deposited directly on the silicon substrate and subsequently a metal silicide is formed with the substrate. This compound formation causes the diffusion of dopants from the metal layer into the underlying silicon layer, increasing the dopant concentration near the silicide silicon interface. However, the substrate itself is consumed to an excessive degree during this compound formation process, which is not suitable for providing very shallow doped regions for use in VLSI.

Thus, while the prior art describes the use of the snowplow effect to redistribute already present dopants, and the diffusion of dopants from an overlying layer into a silicon substrate, no teaching is suggested of a technique for making very shallow doped regions in a substrate at low tempertures, and wherein the substrate is not consumed during production of the doped regions, the doped regions being less than a few hundred angstroms in depth.

Accordingly, it is a primary object of the present invention to provide a low temperature process for forming a doped region in a substrate, where the doped region is very shallow and can have a desired dopant concentration.

It is another object of the present invention to provide an improved technique for formation of VLSI devices at temperatures less than about 700° C.

It is another object of the present invention to provide a process for producing a shallow doped region in a semiconductor substrate, where the doped region can be less than 300 angstroms deep, and wherein the processing temperatures can be below 700° C.

It is another object of this invention to provide a technique for low temperature doping of a semiconductor substrate to provide a shallow doped region therein, without the need for high temperature annealing steps.

It is another object of this invention to provide a low temperature process for introducing n and p type dopants into a silicon semiconductor substrate, where the doped regions are less than about 300 angstroms deep.

It is another object of the present invention to provide a low temperature technique for producing a very shallow doped region in a semiconductor substrate, where the process is particularly suitable for the fabrication of very small structures including devices such as transistors, diodes, contacts, etc.

DISCLOSURE OF INVENTION

In its broadest sense, this invention relates to the provision of overlayers on a substrate, and the reaction of these overlayers to produce a metal compound, there being a snowplow effect to push dopants in one or more of the overlayers into the substrate to create a very shallow doped region therein, the formation of the metal compound being at very low temperatures. The shallow doped region can be used to form a p-n junction in a semiconductor, to adjust a barrier height, to provide contacts (such as ohmic contacts) to a doped semiconductor. Devices such as bipolar and field effect transistors, Schottky barrier diodes, and contacts can be formed by this technique, which is characterized by the provision of a doped region of about 300 angstroms or less in depth, and the provision of such a doped region at a temperature less than 700° C. Preferably, the depth of the doped region is less than about 250 angstroms, while the low temperature is less than 500° C.

The overlayers which are used for forming the metal compound are chosen to form such a compound at a temperature less than 700° C., and the compound is chosen to be one which will exhibit a snowplow effect to such an extent that dopants in one or more of the compoundforming overlayers will be released and pushed, or snowplowed, into the substrate. As an example, this technique has been used to produce very shallow doped regions in a single crystal silicon semiconductor substrate, where the snowplow effect was due to the formation of a metal silicide compound, the interface of the growing silicide region being used to push dopants into the silicon substrate.

Both n- and p-type doped regions can be produced in a substrate (which may also be doped n- or p-type) by this technique, and the dopant concentration can be varied in accordance with the amount of dopant present in the overlayers and in the amount of time/temperature used to produce the metal compound.

These and other objects, features, and advantages will be apparent from the more particular description of the preferred embodiments.

BEST MODE FOR CARRYING OUT THE INVENTION

In a general sense, a plurality of overlayers is deposited on a substrate in which a very shallow doped region is to be created. These overlayers are chosen to be layers which will form a metal compound when the structure comprising the substrate and the overlayers are annealed at a temperature below 700° C., and preferably below 500° C. The overlayers are further chosen to be such that the formation of the metal compound will produce an interface which moves through one of the layers in a direction toward the substrate, and which will release and push dopants in one or more of the overlayers toward and into the substrate. That is, when the interface between the growing metal compound and the substrate advances to and into the substrate, the dopants originating in the overlayers will be pushed into the substrate.

It has been discovered that metal compound formation can be achieved in such a manner that a significant snowplow effect will occur at low temperatures, where the doping concentration can be predetermined and can be high, for example, $10^{21}$ carriers/cm$^3$. Some suitable dopants are the n-type dopants As, Sb, and P, which generally require high temperatures (of the order of 1000° C.) in order to diffuse into a substrate such as silicon, and p-type dopants such as B.

FIGS. 1-5 illustrate the invention for the embodiment wherein the substrate is silicon and the metal compound is a metal silicide formed by annealing overlying metal and silicon layers. Thus, in FIG. 1, the substrate 10 is either an n-doped single crystal silicon layer, or a p-doped single crystal silicon layer. The substrate could, or course, be intrinsic material. A layer 12 of n-doped polycrystalline silicon (or amorphous silicon) is deposited on the substrate 10. This can be done in any of several well known ways, including low temperature chemical vapor deposition or ion implantation into only the layer 12. The n-type dopants in the polysilicon layer 12 can include, for instance, As, Sb and P, all of which are well known n-type dopants. If p-type doping were required, a dopant such as B would be used.

Figure 1:
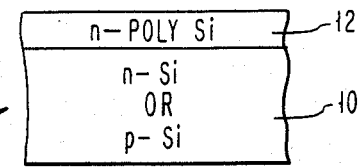
FIGS. 1-5 illustrate the process steps used to provide very shallow doped regions in a substrate, which can be undoped, or doped (n- or p-type).
Figure 2:
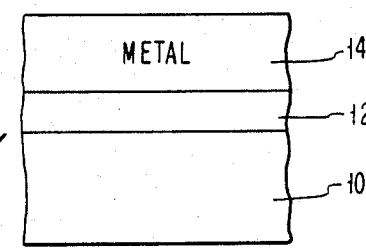

In FIG. 2, an overlying metal layer 14 is deposited on the polysilicon layer 12. For the formation of a metal silicide compound, the metal comprising layer 14 is preferably a noble or or near-noble metal. Suitable metals include Pt, Pd, Ni, Ir, and Rh. Although the refractory metals (Ti, Ta, V) studied so far do not produce silicides having an appreciabille snowplow effect, other refractory metal silicides may work well. However, a higher temperature (between 500°–700° C.) is usually required to form the silicide.

Figure 3:
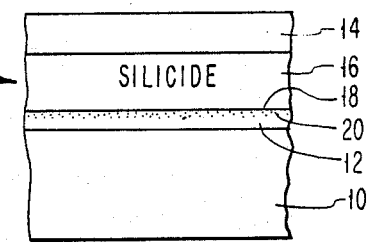

FIG. 3 illustrates an annealing step in which the polysilicon layer 12 and metal layer 14 chemically combine to form a silicide layer 16. This consumes the layers 12 and 14, and produces an interface 18 which moves toward the substrate. The annealing step is performed at temperatures just sufficient to promote the growth of the metal silicide in order to snowplow dopants originally in the polysilicon layer 12. Of course, the dopants can be in the metal layer 14 instead of in the polysilicon layer 12, or can be present in both layers 12 and 14.

Annealing can be accomplished by any means including, for example, heating furnaces, flashlamps, and lasers. The important feature is that a metallic compound is formed, which is most easily achieved by an annealing (i.e., heating) step. Any low temperature step which forms a metallic compound with a moving interface could be used in this invention.

Doping of these layers 12, 14 can be accomplished by chemical vapor deposition of dopant-containing gaseous species together with silicon-containing gaseous species, or by physical vapor deposition (evaporation or sputtering) of dopant and silicon species, or by a combination of chemical and physical vapor deposition.

Doping of these layers 12, 14 can also be accomplished by ion implantation during or after deposition. This has the advantage that the dopants can be introduced at a desired depth in the polysilicon layer 12. By implanting near the single crystal silicon interface (but entirely within the polysilicon layer 12), one can reduce the thickness of the polysilicon and metal layers, the resulting silicide layer, and the annealing time required for silicide formation and snowplow. Implantation gives good control of the doping level. Finally, because the implantation is only into the polysilicon layer 12, no implantation damage is created in the single crystal silicon 10; consequently, no high temperature annealing steps are needed, so the process remains a true low temperature doping technique.

Figure 4:
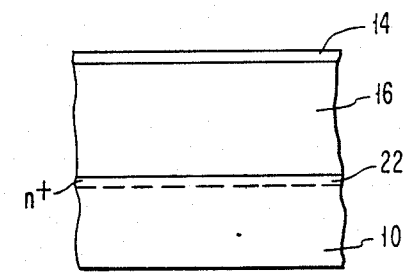

FIG. 4 illustrates the continuation of the annealing step in which the metal layer 14 still remains, but the polysilicon layer 12 has been entirely consumed by the formation of the metal silicide 16. If the annealing is sufficient and the initial thicknesses of the layers 12 and 14 are chosen properly, the compound forming interface 18 will advance entirely through the polysilicon layer 12 and into the silicon substrate 10, producing a new silicide/silicon interface located a small distance inside the original single-crystal silicon substrate 10. When this occurs, a considerable portion of the dopants originally introduced into the polysilicon layer 12 will have been snowplowed ahead of the advancing silicide/silicon interface to form a doped region 22 in the substrate 10. The depth of the doped region 22 into the top surface of the substrate 10 is less than a few hundred angstroms, and is typically about 300 angstroms, or less. The doping concentration in region 22 depends on the initial doping level of substrate 10 and the amount of dopant present in the overlayer 12.

Figure 5:
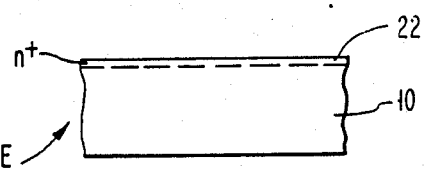

As is apparent from FIG. 5, the conductivity-type of the region 22 can be the same as that of the substrate 10, or opposite. Thus, a contact or a p-n junction can be created. For example, it is possible to dope the region 22 heavily (to an amount greater than $10^{20}$ carriers/$cm^2$) to create an ohmic contact. Varying degrees of dopant concentration can be produced in the shallow doped region 22, to provide rectifying contacts, Schottky barriers, etc.

If the metal 14 and silicide layer 16 are not chemically removed, they can be used as device contacts whose electrical properties can be chosen. Depending on the conduction type of the silicon substrate 10 and the dopant impurity of the polysilicon 12, one can form either low resistance ohmic contacts (n-poly on n-Si or p-poly on p-Si) or a shallow p-n junction (n-poly on p-Si or p-poly on n-Si). If the doping of the polysilicon 12 is low, so that the amount of snowplowed dopant is reduced, then one can form a Schottky diode with electrical characteristics which are adjustable within a certain range according to the actual doping level.

In such cases, the polysilicon layer 12 can be delineated prior to the metal deposition in order to obtain a self-aligned Ohmic contact or p-n junction. In addition, the silicide overlayer 16, which has a low resistivity, can be patterned to form part of the interconnect metallization.

It should be noted that similar results can be obtained by doping the deposited metal layer 14 instead of using a doped polysilicon layer 12, and by using amorphous silicon in place of the polysilicon layer.

If desired, the remaining metal 14 and compound 16 may be chemically removed from the surface of the single crystal silicon substrate 10, leaving the very thin doped region 22 at the surface of the substrate 10. Other processing steps, including the process described here as well as other semiconductor device processes, can subsequently be employed to fabricate further device layers and structures, such as transistors and multilayer and superlattice devices.

In the example of FIGS. 1-5, two layers 12, 14 were used to produce the metal silicide whose moving interface snowplowed dopants into the substrate. However, more than two layers (materials) can be used to produce the metal compound, and the compound need not be a silicide. Noble and near-noble metal silicides are advantageous, however, as these compounds can be formed at very low temperatures, and will have a sufficient snowplow effect to provide efficient doping of the substrate. In addition to the unique advantages of forming metal silicide compounds, these compounds can be used to reduce the resistance of polysilicon lines, and for interconnects and contacts, as will be seen with respect to FIGS. 6 and 7. Still further, the technique characterized by FIGS. 1-5 will work with silicon substrates 10 of different crystallographic structures, such as (111) and (100).

In the practice of this technique, it has been found that a high percentage (greater than 50%) of the snowplowed dopants are electrically active dopants in the substrate 10. This result occurs even at low temperatures (such as 250° C.), in contrast with the high temperature post-annealing step used to produce electrically active dopants when the dopants are introduced by ion implantation. This success at low temperatures is also surprising, considering that these same dopants (As, Sb, P, B, etc.) require high temperatures to be incorporated into the same substrate, when they are introduced by diffusion and ion implantation.

The snowplow effect can be used to introduce dopants into the top surface of the substrate 10 to a controlled, shallow depth. Thus, if there are imperfections (such as dislocations, etc.) or trace impurities in the first few layers of the substrate, the snowplow effect can be used to drive the dopants past these imperfections and impurities into the body of the substrate. In this manner, a very shallow doped region of high integrity and uniformity can be formed at a desired depth in the substrate 10.

Metal layer 14 has a minimum thickness to insure that the entire thickness of layer 12 is consumed during metal compound formation. Typically, the thickness of metal layer 14 is greater than that required to consume all of layer 12, and also to ensure that the growing interface extends into the substrate 10. As was noted, this ensure that the dopants are snowplowed past any slight impurities or imperfections that would exist at the surface of the substrate, in order to create the shallow doped region in the body of the substrate. Of course, if the top surface of the substrate is adequate, the silicide boundary can be made to stop at the beginning of the substrate, if desired (so as to prevent any consumption of the single crystal silicon subtrate 10).

During introduction of the impurities using the snowplow effect, the thicknesses of the layers 12 and 14 are initially determined with respect to the silicide phase which will be formed, in order to have the silicide interface extend the desired amount into the substrate 10. The annealing conditions (temperature, time) are then set to determine where the moving interface will stop. If metal layer 14 is entirely consumed, the fact that the annealing continues will not alter the depth of the silicide interface. Thus, an initial determination of the proper thicknesses of layers 12 and 14 provides a good control over the final location of the silicide interface.

As was mentioned previously, the amount of doping in the overlayers, and their thicknesses, can be used to determine the amount of dopant introduced into the substrate. As an example, if it is assumed that 10% of the dopants in the layer 12 are snowplowed into substrate 10, and it is desired to dope the substrate to a level of about $10^{18}$ carriers/cm$^3$ into a 100 angstrom deep region, then the doping in the polysilicon layer 12 will be about $2 \times 10^{18}$ carriers/cm$^3$. This doping level can be produced in a 500 angstrom thick layer 12 by CVD doping or by implanting at a dosage of $10^{13}$/cm$^2$.

The snowplow effect can be used to increase the doping level of the substrate by several orders of magnitude, or to initially dope intrinsic material. If the substrate is initially doped, it can be doped degenerately in a shallow region by the snowplow effect. Also, if the dopant level in the polysilicon layer 12 is increased to greater than $10^{20}$ carriers/cm$^3$, then a doping level of greater than $10^{18}$ can be produced in the substrate. Generally, the polysilicon layer 12 is about 300 angstroms thick, and can be, for example, 100–500 angstroms thick. Thus, the dopant level in layer 12 can be changed to smoothly change the dopant concentration of shallow region 22, to any desired amount.

While single crystal silicon has been mentioned as a suitable substrate 10, this invention will work with other semiconductor substrates, such as Ge.

Still further, metal silicides are not the only metallic compounds which can be formed at very low temperatures and which will exhibit a snowplow effect. The metal layer 14 may be combined with a doped Ge layer 12 to form germanide compounds 16. Also, the metal layer 14 may be reacted with compound semiconductors (III-V or II-VI) to form new compounds combining metal and semiconductor constituents. For example, layer 12 can be GaAs while metal layer 14 is Pd. During the formation of a metallic compound of Pd and Ga, the As in the GaAs layer would be freed to act as a dopant that would be pushed into the substrate 10. The chemistry of Pd on GaAs is described in more detail by P. Oelhafen et al in J. Vac. Sci. Technol. B, 1 (3), page 588, July/September 1983. Pt is another suitable metal that can be used for layer 14 when layer 12 is GaAs. The chemistry of Pt and GaAs is described by C. Fontaine et al in Appl. Phys. 54, (3), page 1404, March 1983. When these materials are used, it is possible to free As from the GaAs layer, where the freed As would be snowplowed into the substrate 10.

From the foregoing, it is apparent that the dopants which are to be snowplowed into the substrate can be present as dopants in either or both of the layers 12 and 14, or can be a primary constituent of the material comprising one of these layers (such as As which is stoichiometrically joined with Ga to form GaAs).

In the practice of this invention, a layer (such as polysilicon or amorphous silicon layer 12) is provided which is consumed during the metal compoundforming step. This is important to move the interface of the metal compound close to or into the top surface of the substrate 10, and to prevent too much of the substrate 10 from being consumed. For example, if layer 12 were not used and a metal layer were deposited directly onto the silicon substrate 10, annealing would cause a reaction between the metal layer and the silicon substrate, and would consume a large amount of the substrate (comparable to the metal layer 14 thickness during the introduction of dopants into the substrate. This is undesirable, and is one of the problems noted with respect to reference 8. Further, while metal silicides are a particularly good metal compounds to be used in the practice of this invention, not all metal silicides will work. Noble metal and near-noble metal silicides appear to work well and form compounds at low temperatures. On the other hand, refractory metal silicides require higher temperatures of formation, and do not exhibit significant snowplow effects (see reference 5.) Even though the solubility of the same dopant in these different types of silicides may be similar, the refractory metal silicides do not snowplow dopants to the extent that the noble metal and near-noble metal silicides do. This may be explained somewhat by the mechanisms covering the growth of metal silicides, as is described in the aforementioned reference 5.

Figure 6:
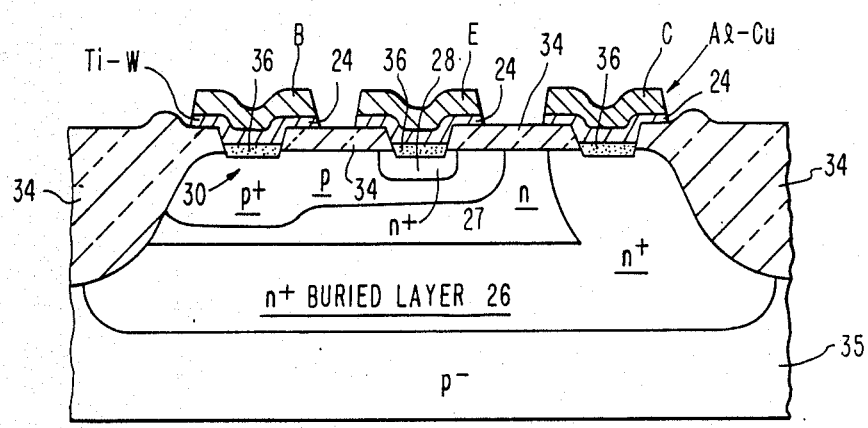
FIG. 6 illustrates the use of this invention to produce very shallow doped regions in a bipolar transistor.
Figure 7:
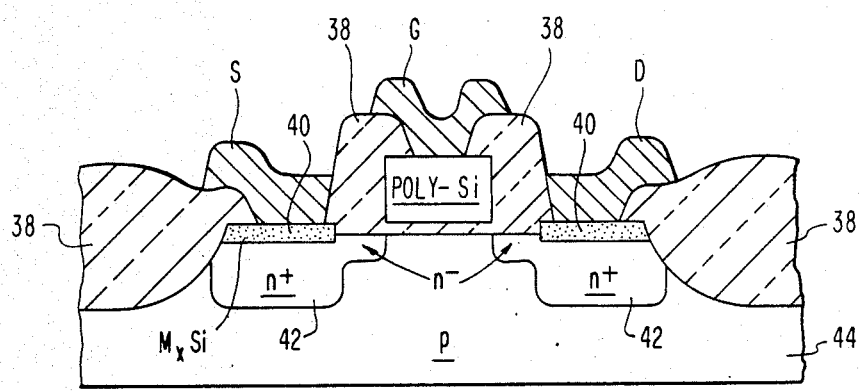
FIG. 7 illustrates another application of this invention to form very shallow doped regions in a field effect transistor.

(FIGS. 6 and 7)

FIGS. 6 and 7 show general diagrams for devices in which the technique of the present invention can be incorporated. While the buried collector transistor structure of FIG. 6 and the field effect device of FIG. 7 are chosen as representative examples, it will be appreciated that the present invention could be used to make other structures and devices.

In FIG. 6, base, emitter, and collector contacts (B, E, and C, respectively) are shown which are comprised of a metal such as Al-Cu. A layer 24 of Ti-W is used as a diffusion barrier. In this n-p-n structure, the collector region is comprised of the n+ buried layer 26 which is a contact to n region 27 while the emitter is comprised of n+ region 28. The base is comprised of a p+ region 30, formed as a portion of the p-type region 32. Insulating regions 34 provide electrical isolation between adjacent devices, and between the emitter, base and collector contacts. The substrate is a p-type silicon wafer 35.

PtSi regions 36 are used to make contact to the underlying doped regions of this device. In order to make the device of FIG. 6, these PtSi compunds can be used to snowplow dopants in order to form low resistivity contacts to region 28 and a shallow doped region 30.

FIG. 7 shows a field effect transistor comprising a source contact S, a gate contact G, and a drain contact D. Insulating regions 38, such as SiO$_2$, are located between adjacent devices, between adjacent metal contacts, and beneath the gate contact G. Metal silicide contacts 40, designated M$_x$Si, make electrical contact to the source and drain n+ regions 42. The substrate 44 is p-silicon.

This invention can be used to make shallow n+ regions 42 beneath the metal silicide 40. For example, regions 42 can be n-type, but of a lesser dopant concentration than the portions of these regions immediately below the silicide 40. During formation of the silicide 40, n-dopants will be snowplowed into the top surface of regions 42, in order to produce n+ doping. In this way, an ohmic contact can be provided between the metal silicide layer 40 and the snowplowed doped region immediately below it.

While binary compounds have been described for use in this invention, it will be understood by those skilled in the art that multiphase compounds such as ternary and higher order compounds can also be used. Further, suitable metal silicides for use in this invention include silicides of metals of the transition series, and rare earth metal silicides, where these transition metals include noble and near-noble metals as well as refractory metals.

While the invention has been described with respect to particular embodiments thereof, it will be understood by those skilled in the art that variations can be made therein, without departing from the spirit and scope of the present invention.

Noble and near noble metals, such as Pt, Pd, Ir, Rh, Ds, Ru, and Ni may be preferred, since they form compounds such as silicides at low temperatures. For example, Pt and Pd will form silicides at approximately 250° C., while most refractory metals form silicides at higher temperatures (500°–700° C.). Also, for the metals studied thus far, the noble and near-noble silicides exhibit a stronger snowplow effect than do the refractory metal silicides. However, it is believed that at least some refractory metals may provide silicides useful for the present invention, or other compounds which will exhibit an effective snowplow effect. Refractory metals, such as Cr and Ti, may be suitable. Rare earth metals can also be used, such as Er, and Sm.

Si, Ge, and GaAs were mentioned as suitable materials for the overlayer 12. However, other materials can be chosen in accordance with the principles of this invention. For example, overlayer 12 can be comprised of a III-V material other than GaAs, such as InP. Other suitable materials for overlayer 12 include II-VI materials such as CdTe and ZnSe. Suitable metal layers with these III-V and II-VI materials are, for example, Pt and Pd.

In the practice of this invention, the dopant can be present as a dopant in an overlayer (such as p in polysilicon) or can be a primary constituent of the overlayer (such as As in GaAs). The element to be used to dope the substrate can also be present as a dopant in a III-V or II-VI material, such as a Zn dopant in GaAs. During metal compound formation between the metal and/or Ga and As, the Zn would be released and pushed into the substrate. This technique can be used to dope a substrate with any kind of dopant, or dopants to produce different types of devices, including light emitting diodes, etc.

What is claimed is:

1. A method for producing a very shallow doped region in a substrate, comprising the steps of:

depositing at least two overlayers on the top surface of said substrate, one of which contains metal atoms, to produce a multilayered structure, said overlayers being capable of forming a metal compound when treated at a temperature less than 700° C., and wherein at least one of said overlayers contains an element to be introduced as an n-type dopant into said substrate to produce said shallow doped region therein, treating said multilayer structure at a temperature less than 700° C. to form said metal compound, the formation of said metal compound releasing said element and producing a sharp compound formation interface which moves toward said substrate and pushes said n-type dopant by the snowplow effect toward said substrate and pushes said dopant by the snowplow effect toward said silicon substrate, and continuing said treating step for a time sufficient to move said interface to said substrate to push said n-type dopant into the body of said substrate a distance not exceeding 300 angstroms from the top surface of said substrate.

2. A method for producing a very shallow doped region in a substrate, comprising the steps of:

depositing at least two overlayers on the top surface of said substrate, said substrate being a single crystal silicon layer, one of which contains metal atoms, to produce a multilayered structure, said overlayers being capable of forming a metal silicide compound when treated at a temperature less than 700° C., and wherein at least one of said overlayers contains an element to be introduced as a dopant into said substrate to produce said shallow doped region therein, treating said multilayer structure at a temperature less than 700° C. to form said metal silicide compound, the formation of said metal silicide compound releasing said element and producing a sharp compound formation interface which moves toward said silicon substrate and pushes said dopant by the snowplow effect toward said silicon substrate, and continuing said treating step for a time sufficient to move said interface to said silicon substrate to push said dopant into the body of said silicon substrate a distance not exceeding 300 angstroms from the top surface of said substrate.

3. The method of claim 2, where said dopant is a p-type dopant.

4. The method of claim 2, where said substrate is a semiconductor.

5. The method of claim 2, including the further step of removing said overlayers from the top surface of said substrate, when said treating step is completed.

6. The method of claim 2, where one of said overlayers is a metal, selected from the group consisting of transition metals noble and near-noble metals, and rare earth metals, and another of said overlayers is comprised of silicon, wherein said substrate is a single crystal silicon layer.

7. The method of claim 6, where said silicon overlayer is selected from the group consisting of amorphous silicon and polycrystalline silicon.

8. The method of claim 7, where said dopant is located in said silicon material.

9. The method of claim 2, where said substrate is doped and has the same conductivity type as said shallow doped region produced therein.

10. The method of claim 9, where said dopant has p-type conductivity.

11. The method of claim 2, where said substrate is doped and has the opposite conductivity type as said shallow doped region produced therein.

12. A method for producing a very shallow doped region in a substrate, comprising the steps of:
depositing at least two overlayers on the top surface of said substrate, one of which is a metal layer and the other of which is a semiconductor, to produce a multilayered structure, said overlayers being capable of forming a metal compound when treated at a temperature less than 700° C., and wherein at least one of said overlayers contains an element to be introduced as a dopant into said substrate to produce said shallow doped region therein,
treating said multilayer structure at a temperature less than 700° C. to form said metal compound, the formation of said metal compound releasing said element and producing a sharp compound formation interface which moves toward said substrate and pushes said dopant by the snowplow effect toward said substrate, and
continuing said treating step for a time sufficient to move said interface to said substrate to push said dopant into the body of said substrate a distance not exceeding 300 angstroms from the top surface of said substrate.

13. The method of claim 12, where said dopant is located in said semiconductor overlayer.

14. The method of claim 12, where said dopant is located in said metal overlayer.

15. The method of claim 12, where one of said overlayers is a material selected from the group consisting of III-V and II-VI materials.

16. A method for producing a very shallow doped region in a semiconductor substrate, comprising the steps of:
depositing at least two overlayers on the top surface of said substrate, one of which contains metal atoms and is a metal layer selected from the group consisting of Pt, Pd, Ni, Ir, Rh, Os, Cr, Co, Ru and the other of which is a semiconductor selected from the group consisting of Si, Ge, GaAs, InP, CdTe, and ZnSe, to produce a multilayered structure, said overlayers being capable of forming a metal compound when treated at a temperature less than 700° C., and wherein at least one of said overlayers contains an element to be introduced as a dopant into said substrate to produce said shallow doped region therein,
treating said multilayer structure at a temperature less than 700° to form said metal compound, the formation of said metal compound releasing said element and producing a sharp compound formation interface which moves toward said semiconductor substrate and pushes said dopant by the snowplow effect toward said substrate, and
continuing said treating step for a time sufficient to move said interface to said substrate to push said dopant into the body of said substrate a distance not exceeding 300 angstroms from the top surface of said substrate.

17. A method for producing a very shallow doped region in a substrate, comprising in combination the following steps:
depositing on a substrate comprising a single crystal silicon layer at least two overlayers to produce a multilayer structure, wherein one overlayer is comprised of a metal selected from the group consisting of transition series metals and rare earth metals and another of said overlayers is comprised of silicon selected from the group consisting of polycrystalline silicon and amorphous silicon, wherein said overlayers are capable of forming a metal silicide when annealed at a temperature less than 700° C., and wherein at least one of said overlayers contains a material to be introduced as a dopant into said substrate to produce said shallow doped region therein,
annealing said multilayered structure at a temperature less than 700° C. to form said metal silicide, the formation of said metal silicide producing a sharp silicide-silicon interface which moves toward said single crystal substrate and pushes said dopant by the snowplow effect towards said substrate,
continuing said annealing for a time sufficient to move said interface to said substrate to push said dopant into the body of said substrate a distance not exceeding about 300 angstroms from the top surface of said substrate.

18. The method of claim 17, where said metal overlayer is selected from the group consisting of Pt, Pd, Ni, Ir, Os, Co, Cr, Ru and Rh metals.

19. The method of claim 17, where said dopant is located in said silicon overlayer.

20. The method of claim 17, where said dopant is located in said metal overlayer.

21. The method of claim 17, where said dopant is present in more than one of said overlayers.

22. The method of claim 17, where the thickness of said metal overlayer is chosen such that all of said silicon overlayer is consumed during formation of said metal silicide compound.

23. The method of claim 17, where said silicon overlayer is deposited on said substrate, and said metal layer is deposited on said silicon overlayer.

24. The method of claim 17, where said dopant is of n-type conductivity.

25. The method of claim 17, where said dopant is selected from the group consisting of B, P, As, and Sb.

26. A method for forming a very shallow doped region in a substrate, comprising the following steps:
depositing at least two overlayers over the top surface of said substrate, one of which contains metal atoms, to produce a multilayered structure, said layers being capable of forming a metal compound when annealed at a temperature less than about 700° C., wherein one of said overlayers is a compound having a constituent thereof which is to be introduced as a dopant into said substrate to produce said shallow doped region therein,
annealing said multilayer structure at a temperature less than 700° C. to form said metal compound between said overlayers, the formation of said metal compound releasing said constituent and producing a sharp compound formation interface which moves toward said substrate and pushes said constituent dopant by the snowplow effect toward said substrate,
continuing said annealing for a time sufficient to move said interface to said substrate to push said constituent dopant into the body of said substrate a distance not exceeding about 300 angstroms from the top surface of said substrate.

27. A method for forming a very shallow doped region in a substrate, comprising the following steps:
- depositing at least two overlayers over the top surface of said substrate, one of which is comprised of a metal selected from the group consisting of Pd, Pt, Ni, Rh, Ir, Cr, and Co, to produce a multilayered structure, said layers being capable of forming a metal compound when annealed at a temperature less than about 700° C. wherein one of said overlayers is a compound having a constituent thereof which is to be introduced as a dopant into said substrate to produce said shallow doped region therein,
- annealing said multilayer structure at a temperature less than 700° C. to form said metal compound between said overlayers, the formation of said metal compound releasing said constituent and producing a sharp compound formation interface which moves toward said substrate and pushes said constituent dopant by the snowplow effect toward said substrate, and
- continuing said annealing for a time sufficient to move said interface to said substrate to push said constituent dopant into the body of said substrate a distance not exceeding about 300 angstroms from the top surface of said substrate.

28. The method of claim 27, where said substrate is a semiconductor, one of said overlayers is a metal, and another of said overlayers is selected from the group consisting of III-V and II-VI compounds.

29. The method of claim 27, where said semiconductor substrate is comprised of silicon.

30. A method for producing a very shallow doped region in a silicon single crystal substrate, comprising the steps of:
- depositing at least two overlayers on the top surface of said substrate, one of which contains a metal and the other of which contains silicon, to produce a multilayered structure, said overlayers being capable of forming a metal silicide compound when annealed at a temperature less than 500° C., and wherein at least one of said overlayers contains an element to be introduced as a dopant into said substrate to produce said shallow doped region therein,
- annealing said multilayer structure at a temperature less than 500° C. to form said metal silicide compound, the formation of said metal silicide releasing said element and producing a sharp silicide-silicon interface which moves toward said substrate and pushes said element by the snowplow effect toward said substrate, and
- continuing said annealing for a time sufficient to move said interface to said substrate to push said element into the body of said substrate a distance not exceeding about 300 angstroms from the top surface of said substrate.

* * * * *